(12) United States Patent
Ikegami (10) Patent No.: US 8,212,490 B2
(45) Date of Patent: Jul. 3, 2012

(54) LIGHT SOURCE DEVICE, IMAGE DISPLAY APPARATUS, AND METHOD OF DRIVING LIGHT EMITTING ELEMENT

(75) Inventor: Tomio Ikegami, Chino (JP)

(73) Assignee: Seiko Epson Corporation, Tokyo (JP)

( * ) Notice: Subject to any disclaimer, the term of this patent is extended or adjusted under 35 U.S.C. 154(b) by 456 days.

(21) Appl. No.: 12/538,730

(22) Filed: Aug. 10, 2009

(65) Prior Publication Data

US 2010/0074283 A1    Mar. 25, 2010

(30) Foreign Application Priority Data

Sep. 25, 2008    (JP) .................................. 2008-246238

(51) Int. Cl.
*H01S 5/062*    (2006.01)
(52) U.S. Cl. ....................................... 315/246; 315/291
(58) Field of Classification Search .................. 315/246, 315/291, 224, 307, 308
See application file for complete search history.

(56) References Cited

U.S. PATENT DOCUMENTS

| 6,205,162 | B1 | 3/2001 | Shodo |
| 7,259,525 | B2 * | 8/2007 | Yang ............................. 315/291 |
| 2009/0195180 | A1 * | 8/2009 | Chenetz ....................... 315/291 |

FOREIGN PATENT DOCUMENTS

| JP | 06-013659 | 1/1994 |
| JP | 10270805 A | 10/1998 |
| JP | 2007-140009 | 6/2007 |

* cited by examiner

*Primary Examiner* — Daniel D Chang
(74) *Attorney, Agent, or Firm* — Maschoff Gilmore & Israelsen (57) ABSTRACT

A light source device includes: a light emitting element; a pulse drive section adapted to supply the light emitting element with a pulse current in order for controlling an average emission light intensity from the light emitting element; and a light emitting element shunt section disposed in parallel to the light emitting element and adapted to shunt the light emitting element.

18 Claims, 11 Drawing Sheets

PRIOR ART
FIG. 1

FIG. 2A
PWM SIGNAL
PRIOR ART

FIG. 2B
DRIVE CURRENT $I_{LD}$
PRIOR ART

FIG. 3A
IDEAL LASER DIODE DRIVE CHARACTERISTIC

PRIOR ART

FIG. 3B
LASER DIODE DRIVE CHARACTERISTIC OF CIRCUIT SHOWN IN FIG. 1

PRIOR ART

FIG. 3C

PRIOR ART

LIGHT SOURCE DEVICE, IMAGE DISPLAY APPARATUS, AND METHOD OF DRIVING LIGHT EMITTING ELEMENT

BACKGROUND

1. Technical Field

The present invention relates to a driving technology for a light emitting device, with which the light emitting element is driven in a pulsed manner.

2. Related Art

Since in image display apparatuses such as laser-scanning displays (see, e.g., JP-A-2007-140009) or laser type projectors, the emission light intensity of the light emitting element is controlled for each of the pixels constituting a picture, pulse width modulation for controlling the duration of supplying the light emitting element with a current in a period (pixel time) for displaying each of the pixels is performed. JP-A-6-013659 is an example of a related art document.

Figure 1:
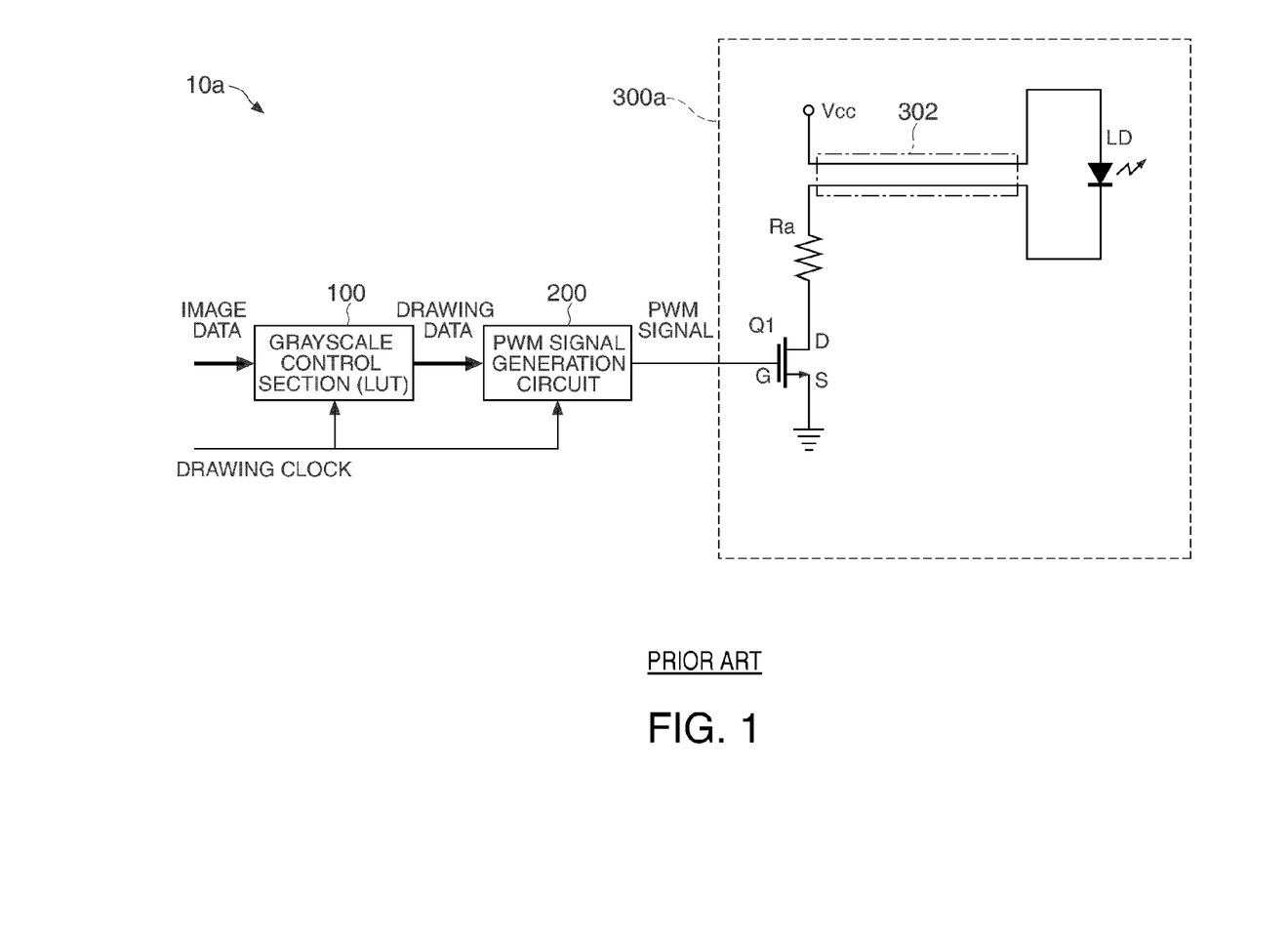
FIG. 1 is a schematic diagram showing a configuration of an image output unit using a laser diode.

FIG. 1 is a schematic diagram showing an image output unit 10a in an image display apparatus using a laser diode. The image output unit 10a is composed of a grayscale control section 100, a pulse width modulation (PWM) signal generation circuit 200, a light source circuit 300a using a laser diode LD.

The grayscale control section 100 is supplied with image data for designating the display grayscale for each pixel. The grayscale control section 100 is configured as a look-up table (LUT). By reference to the look-up table, the drawing data for designating the emission light intensity of the laser diode for each pixel is generated. The drawing data thus generated is supplied to the PWM signal generation circuit 200. The PWM signal generation circuit 200 generates a PWM signal for controlling the emission light intensity of the laser diode to be the value designated by the drawing data. The PWM signal is a binary signal with an H-level and an L-level respectively designating ON and OFF of the current to be supplied to the laser diode. It should be noted that the grayscale control section 100 and the PWM signal generation circuit 200 are supplied with a drawing clock for defining timing of the pixel time.

The light source circuit 300a has a laser diode LD, a load resistance Ra, and a switching transistor Q1. The laser diode LD, the load resistance Ra, and the switching transistor Q1 are connected in series in this order. The anode of the laser diode LD is connected to a power supply (not shown) for driving the laser diode LD, and the power supply voltage Vcc is applied thereto. The laser diode LD is connected to a supply section of the power supply voltage Vcc and the load resistance Ra via a driving connection line 302. It should be noted that although an n-type MOSFET is used as the switching transistor Q1 in FIG. 1, various types of switching element such as a p-type MOSFET, a bi-polar transistor, or a junction FET can also be used as the switching transistor Q1.

The gate (G) of the switching transistor Q1 is connected to the PWM signal generation circuit 200. When the PWM signal supplied from the PWM signal generation circuit 200 becomes in the H-level to make the gate have the voltage higher than that of the source (S), which is grounded, the switching transistor Q1 becomes in the conduction state (ON state) between the drain (D) and the source (S). Therefore, a current flows through the laser diode LD, the load resistance Ra, and the channel between the drain (D) and the source (S) of the switching transistor Q1, and the laser diode LD emits light. On the other hand, when the PWM signal is switched to be in the L-level, and the gate (G) and the source (S) become in approximately the same level, the channel between the drain (D) and the source (S) of the switching transistor Q1 is switched to be in the non-conductive state (OFF state). Thus, the current stops flowing through the laser diode LD, and the laser diode LD stops emitting the light.

Figure 2A:
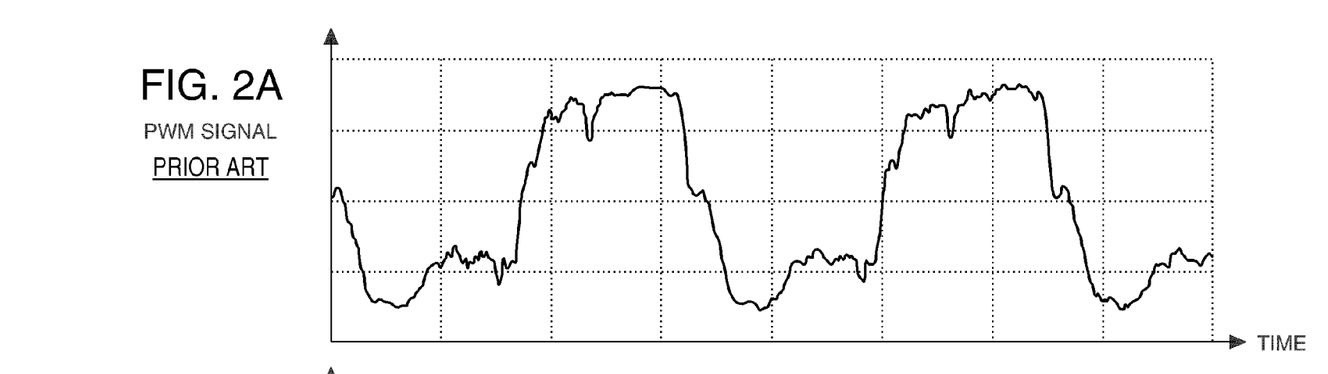
FIGS. 2A and 2B are explanatory diagrams showing a condition when a laser diode is driven with the light source circuit shown in FIG. 1.
Figure 2B:
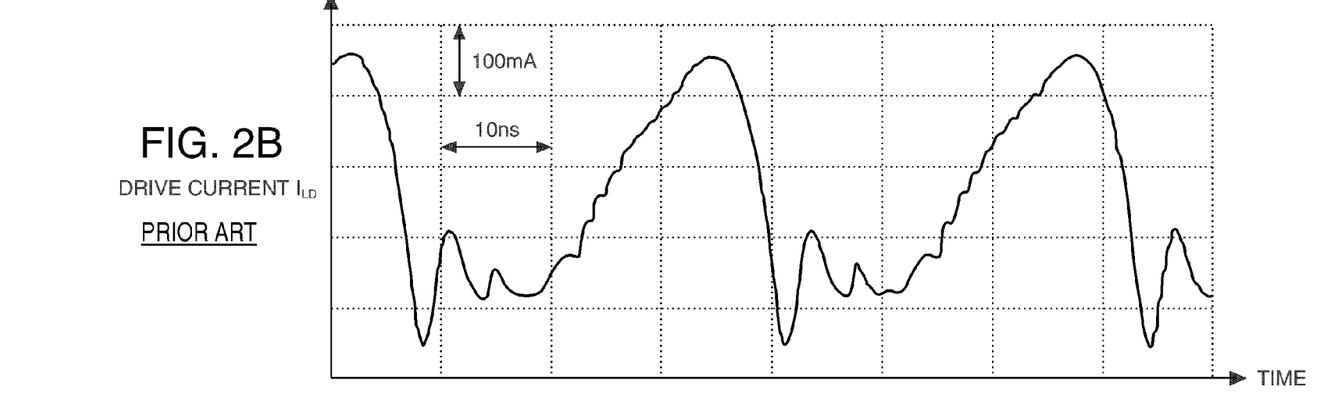

FIGS. 2A and 2B are explanatory diagrams showing a condition of driving the laser diode LD by the light source circuit 300a shown in FIG. 1. FIG. 2A is a graph showing the PWM signal supplied to the light source circuit 300a. FIG. 2B is a graph showing a drive current $I_{LD}$ flowing through the laser diode LD. The horizontal axes of FIGS. 2A and 2B each represent time. The vertical axis of FIG. 2A represents the voltage of the PWM signal, and the vertical axis of FIG. 2B represents the drive current $I_{LD}$ of the laser diode LD.

As shown in FIGS. 2A and 2B, when the PWM signal becomes in the H-level, the switching transistor Q1 becomes in the ON state, and the current flows through the laser diode LD. However, as shown in FIG. 1, the laser diode LD is connected to a supply section of the power supply voltage Vcc and the load resistance Ra via a driving connection line 302. Since the driving connection line 302 has some inductance, even if the voltage applied to the power supply voltage supply section is formed as a rectangular wave, there occurs a delay in increasing the drive current $I_{LD}$ caused by the inductance. As a result, the waveform of the drive current $I_{LD}$ approximates a ramp wave gradually increasing from the leading edge of the pulse toward the trailing edge thereof. Since in general the emission light intensity of the laser diode LD is proportional to the drive current $I_{LD}$, if the waveform of the drive current $I_{LD}$ becomes the ramp wave, the waveform of the emission light intensity also becomes the ramp wave.

Figure 3A:
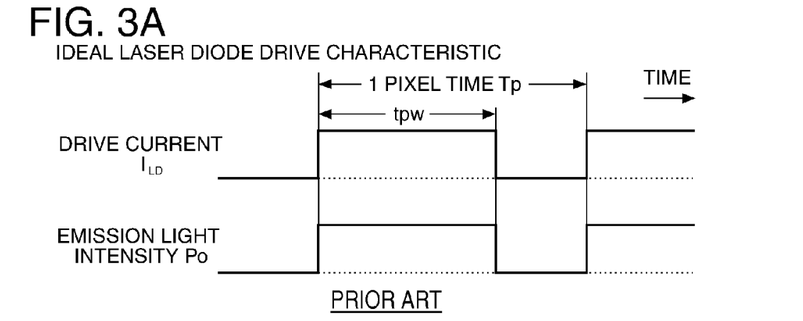
FIGS. 3A through 3C are explanatory diagrams showing an influence exerted on emission light intensity by the drive characteristic of the laser diode.
Figure 3B:
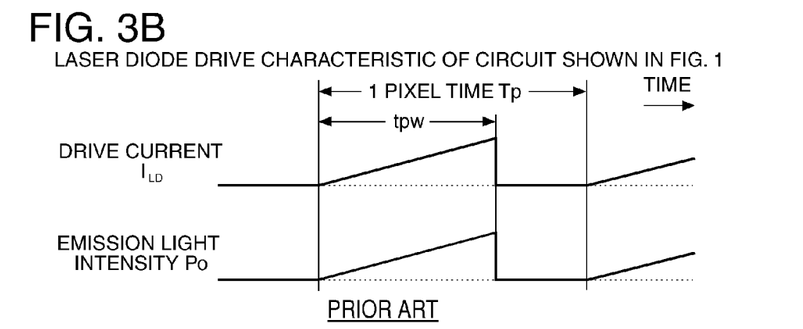
Figure 3C:
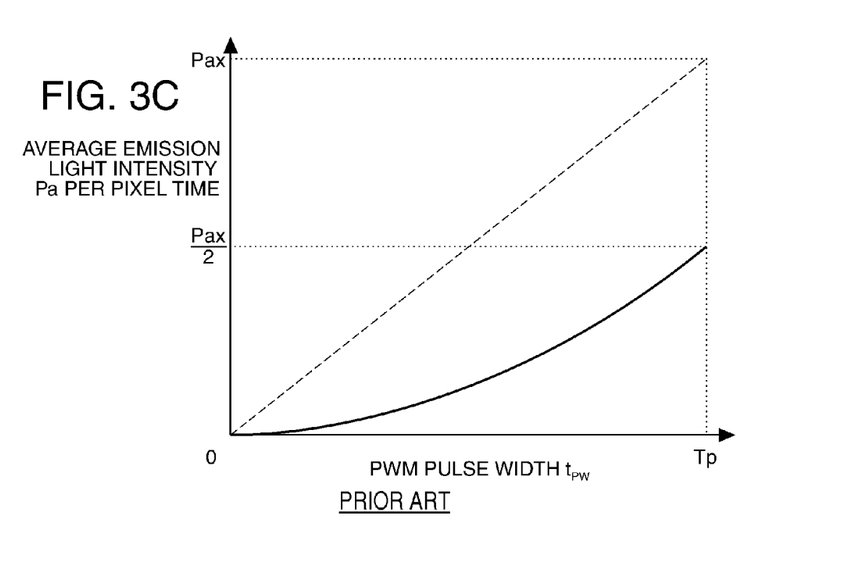

FIGS. 3A through 3C are explanatory diagrams showing an influence exerted on the emission light intensity by the drive characteristic of the laser diode. FIG. 3A shows an ideal laser diode drive characteristic, and FIG. 3B shows the laser diode drive characteristic of the circuit shown in FIG. 1. FIG. 3C is a graph showing a relationship between a pulse width $t_{PW}$ and an average emission light intensity Pa per pixel time when the laser diode is driven with the drive characteristics shown in FIGS. 3A and 3B.

As shown in FIG. 3A, the PWM signal with the rectangular waveform becomes in the H-level during a period $t_{PW}$ corresponding to the average emission light intensity Pa in one pixel time Tp. Further, if the drive of the laser diode is performed ideally, the waveform of the emission light intensity Po of the laser diode becomes a rectangular wave with the same pulse width $t_{PW}$ as that of the PWM signal. On the other hand, as described above, since the waveform of the drive current $I_{LD}$ becomes the ramp wave in the drive circuit shown in FIG. 1, the waveform of the emission light intensity Po also becomes the ramp wave as shown in FIG. 3B.

The total light intensity of the light emitted from the laser diode in one pixel time Tp is obtained by time-integrating the emission light intensity Po in the corresponding pixel time. Therefore, as illustrated with the broken line in FIG. 3C, if the laser diode is driven ideally, the average emission light intensity Pa is proportional to the pulse width $t_{PW}$. On the other hand, if the drive circuit shown in FIG. 1 is used, since the waveform of the emission light intensity Po becomes a ramp wave, the average emission light intensity Pa varies along the square of the pulse width $t_{PW}$. As described above, if the relationship between the average emission light intensity Pa and the pulse width $t_{PW}$ is nonlinear, it becomes difficult to control the average emission light intensity Pa in accordance with the grayscale of the image data. Further, the average emission light intensity Pa in the case in which the pulse width $t_{PW}$ becomes the one pixel time Tp, namely the maximum value of the average emission light intensity Pa becomes a half as large as in the case in which the waveform of the emission light intensity Po is an ideal rectangular waveform, if the waveform of the emission light intensity Po becomes a ramp waveform.

As described above, if rising of the drive current $I_{LD}$ becomes slow, rising of the emission light intensity Po becomes slow, it becomes difficult to control (grayscale control) the average emission light intensity Pa in accordance with the display grayscale value, and further, the maximum value of the average emission light intensity Pa is lowered. This problem is a problem common to various light source devices for supplying a light emitting element with a pulse current and controlling the average emission light intensity of the light emitted from the light emitting element.

SUMMARY

Various embodiments make the rising of the emission light intensity faster in the light source device for supplying the light emitting element with a pulse current and controlling the average emission light intensity of the light emitted from the light emitting element.

In order for providing a solution to at least a part of the problem described above, the invention can be embodied as the aspects or the embodiments described below.

One embodiment is directed to a light source device using a light emitting element, including a pulse drive section adapted to supply the light emitting element with a pulse current in order for controlling an average emission light intensity from the light emitting element, and a light emitting element shunt section disposed in parallel to the light emitting element and adapted to shunt the light emitting element.

According to one embodiment, when the device is switched from the shunted state in which the light emitting element is shunted to the non-shunted state in which the light emitting element is not shunted, the current flowing through the light emitting element shunt section in the shunted state is rapidly supplied to the light emitting element. By thus making the rising of the current flowing through the light emitting element faster, rising of the emission light intensity from the light emitting element can be made faster.

In one embodiment, the light emitting element shunt section shunts the light emitting element in a transitional period of the pulse current.

According to one embodiment, the light emitting element is shunted in a transitional period of the pulse current. Therefore, rising of the pulse current in the transitional period becomes faster, and it is possible to switch the light emitting element to the non-shunted state at earlier timing. Therefore, it is possible to make the shunted state in which the current flows through the light emitting element shunt section last for a shorter period of time, thus the efficiency of the light source device can be enhanced.

In one embodiment, a pulse signal generation section adapted to generate a pulse signal for instructing the pulse drive section to supply the light emitting element with the pulse current, and a shunt signal generation section adapted to generate a shunt signal for instructing the light emitting element shunt section to shunt the light emitting element are further provided, and the shunt signal generation section generates the shunt signal by inverting and delaying the pulse signal.

According to one embodiment, the current flows through the light emitting element shunt section for a period corresponding to the delay time of the pulse signal. Therefore, it becomes possible to reduce the heating value in the light emitting element shunt section, and it is possible to achieve downsizing of the light emitting shunt section and improvement of the efficiency of the light source circuit.

In one embodiment, the pulse signal generation section generates the pulse signal so as to provide a continuous current to the light emitting element when the average emission light intensity is set to be maximum.

According to one embodiment, since the pulse signal is generated so as to provide a continuous current to the light emitting element, if the emission light intensity is set to be maximum, the shunt of the light emitting element by the light emitting element shunt section is not executed. Therefore, it becomes possible to further reduce the heating value in the light emitting element shunt section, and it is possible to achieve further downsizing of the light emitting shunt section and improvement of the efficiency of the light source circuit.

In one embodiment, the pulse drive section supplies the light emitting element with the pulse current by switching an ON state and an OFF state of a switching transistor, and the light emitting element shunt section shunts the light emitting element by setting the shunting transistor, which has an allowable loss smaller than that of the switching transistor, to the ON state.

According to one embodiment, by using the transistor with the allowable loss smaller than that of the switching transistor as the shunting transistor, the shunting transistor can be made smaller. Therefore, it is possible to dispose the shunting transistor closer to the light emitting element, thereby reducing the influence of the inductance and the capacitance of the wiring between the light emitting element and the shunting transistor, and it becomes possible to make the rising of the current flowing through the light emitting element faster.

In one embodiment, the pulse drive section supplies the light emitting element with the pulse current by switching an ON state and an OFF state of a switching transistor, and the light emitting element shunt section shunts the light emitting element by setting the shunting transistor, which has an ON resistance higher than that of the switching transistor, to the ON state.

According to one embodiment, by using the transistor with the ON resistance higher than that of the switching transistor as the shunting transistor, the shunting transistor can be made smaller. Therefore, it is possible to dispose the shunting transistor closer to the light emitting element, thereby reducing the influence of the inductance and the capacitance of the wiring between the light emitting element and the shunting transistor, and it becomes possible to make the rising of the current flowing through the light emitting element faster.

It should be noted that the invention can be realized in various forms such as a light source device, an image display apparatus and an image display method, a control device and a control method of a light source device or an image display apparatus, a computer program for realizing the function and the method of such devices and an apparatus, a recording medium on which the computer program is recorded, or a data signal including the computer program and realized in a carrier wave.

BRIEF DESCRIPTION OF THE DRAWINGS

Embodiments will now be described with reference to the accompanying drawings, wherein like numbers reference like elements.

DESCRIPTION OF AN EXEMPLARY EMBODIMENT

A. Configuration of Image Output Unit

Figure 4:
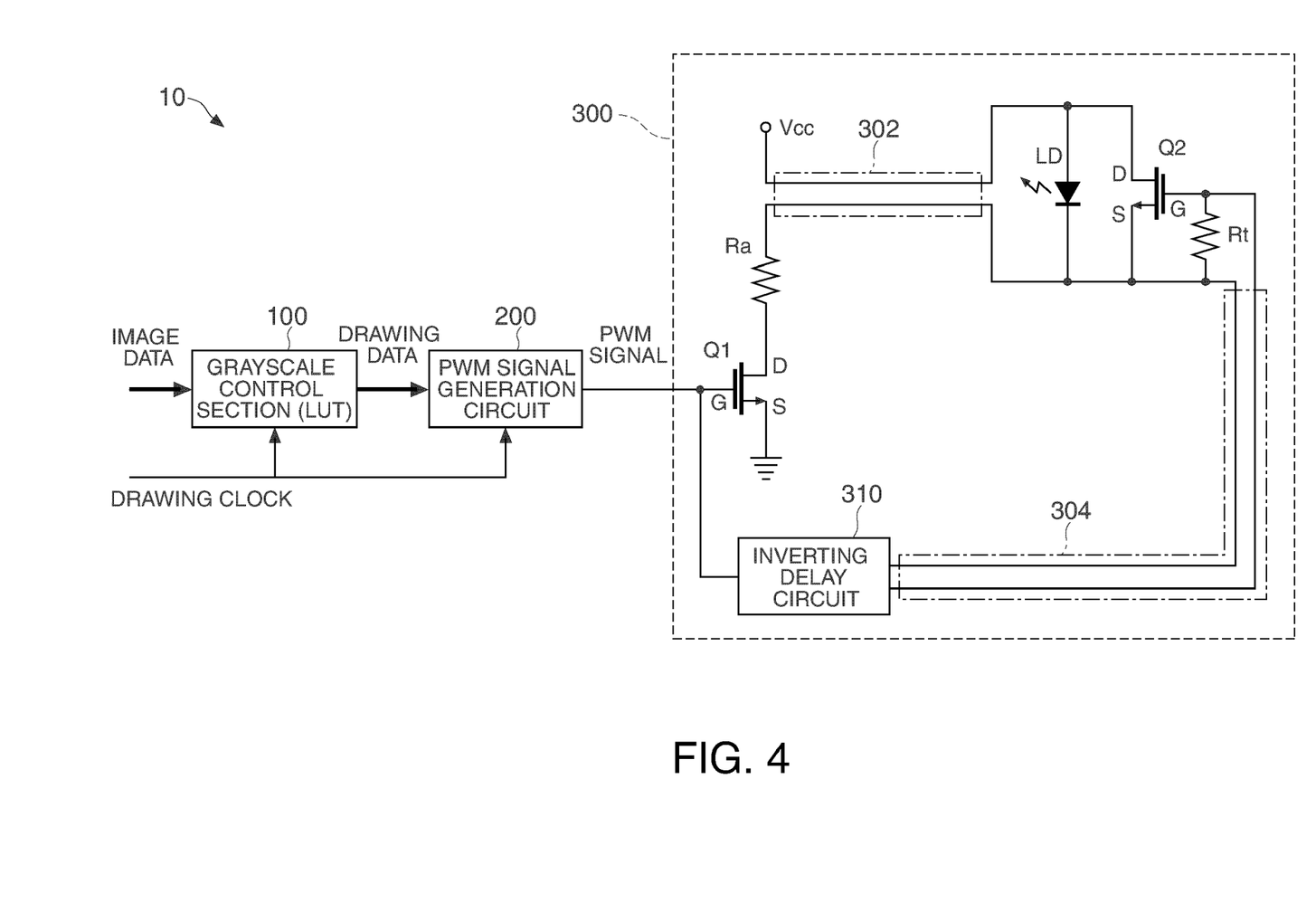
FIG. 4 is an explanatory diagram showing a configuration of an image output unit as an embodiment.

FIG. 4 is an explanatory diagram showing a configuration of an image output unit 10 as an embodiment of the invention. The image output unit 10 is different from the image output unit 10a shown in FIG. 1 in the configuration of the light source circuit 300. Other points thereof are the same as in the image output unit 10a shown in FIG. 1. As shown in FIG. 4, the light source circuit 300 of the present embodiment is obtained by adding an inverting delay circuit 310, a shunt transistor Q2, and a termination resistance Rt to the light source circuit 300a shown in FIG. 1. It should be noted that although an n-type MOSFET is used as the shunt transistor Q2 in FIG. 4, various types of switching element such as a p-type MOSFET, a bi-polar transistor, or a junction FET can also be used as the shunt transistor Q2.

The inverting delay circuit 310 is connected to the PWM signal generation circuit 200. The inverting delay circuit 310 inverts the PWM signal supplied from the PWM signal generation circuit 200 between the H-level and the L-level, and delays the PWM signal for a predetermined delay time ΔT (e.g., 3 ns). Level shift is executed according to needs on the PWM signal thus inverted and delayed, and the result is supplied, as a shunt signal, to the termination resistance Rt and the shunt transistor Q2 via a shunt signal connection line 304.

The termination resistance Rt is connected in parallel to the channel between the gate (G) and the source (S) of the shunt transistor Q2. The termination resistance Rt is set to have a resistance value approximately the same as the characteristic impedance of the shunt signal connection line 304. As described above, by setting the resistance value of the termination resistance Rt to be approximately the same as the characteristic impedance (impedance matching), the waveform of the shunt signal applied to the channel between the gate (G) and the source (S) of the shunt transistor Q2 becomes approximately the same as the waveform of the shunt signal output by the inverting delay circuit 310.

When the shunt signal becomes in the H-level to make the gate voltage of the shunt transistor Q2 higher than the source voltage thereof, the channel between the drain (D) and the source (S) of the shunt transistor Q2 becomes in the conduction state (ON state). Therefore, when the shunt signal is in the H-level, the channel between the anode and the cathode of the laser diode LD is shunted. On the other hand, when the shunt signal becomes in the L-level to make the gate voltage of the shunt transistor Q2 approximately the same as the source voltage thereof, the channel between the drain (D) and the source (S) of the shunt transistor Q2 becomes in the non-conduction state (OFF state). Thus, the connection state of the laser diode LD becomes approximately the same as the state shown in FIG. 1.

B. Model of Light Source Circuit

FIGS. 5A through 5C, and 6A through 6C are explanatory diagrams schematically showing the light source circuit 300 of the present embodiment with the shunt transistor Q2 in the OFF state, namely the light source circuit 300a shown in FIG. 1.

Figure 5A:
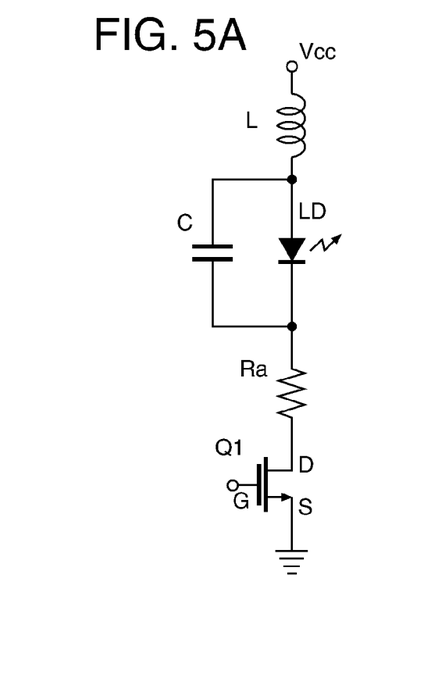
FIGS. 5A through 5C are explanatory diagrams schematically showing the light source circuit with a shunt transistor in the OFF state.
Figure 5B:
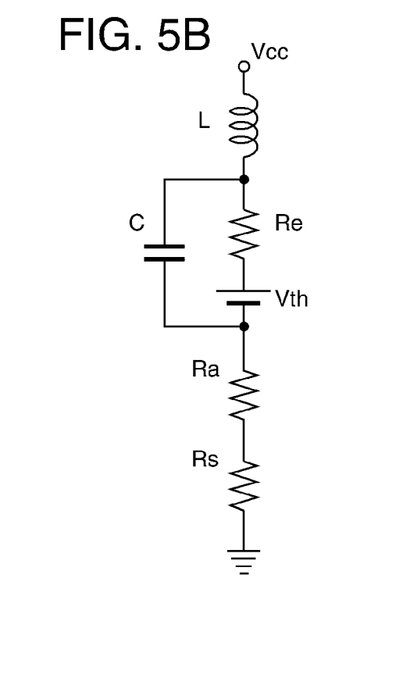

FIG. 5A shows the light source circuit 300a having the driving connection line 302 modeled with an inductance L and a capacitance C. FIG. 5B shows an equivalent circuit of the light source circuit 300a with the switching transistor Q1 in the ON state. The equivalent circuit shown in FIG. 5B is determined in accordance with a relationship (I-V characteristic), shown in FIG. 5C, between the drive current $I_{LD}$ flowing through the laser diode LD between the terminals thereof and the inter-terminal voltage $V_{LD}$ applied between the terminals thereof.

Figure 5C:
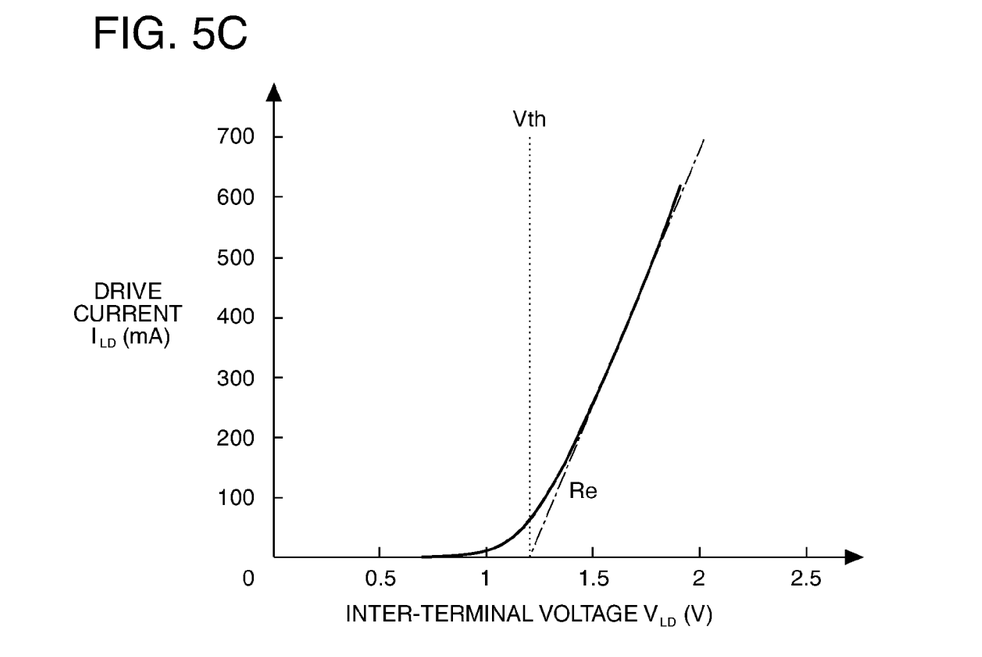

As shown in FIG. 5C, in the area where the inter-terminal voltage $V_{LD}$ is low, the drive current $I_{LD}$ hardly rises even when the inter-terminal voltage $V_{LD}$ rises. On the other hand, when the inter-terminal voltage $V_{LD}$ rises beyond a certain voltage value, the drive current $I_{LD}$ starts increasing. From then on, the drive current $I_{LD}$ varies linearly with respect to the inter-terminal voltage $V_{LD}$ as illustrated with the dashed line. Therefore, the laser diode LD can be approximated with an equivalent resistance (differential resistance) Re corresponding to the gradient with which the drive current $I_{LD}$ varies linearly with respect to the inter-terminal voltage $V_{LD}$ and a direct-current voltage source Vth coupled in series to the equivalent resistance Re.

Further, during the period in which the switching transistor Q1 is in the ON state, the channel between the drain (D) and the source (S) has an ohmic characteristic. Therefore, by representing the switching transistor Q1 with the ON resistance Rs, the light source circuit 300a shown in FIG. 5A can be represented with the equivalent circuit shown in FIG. 5B.

Figure 6A:
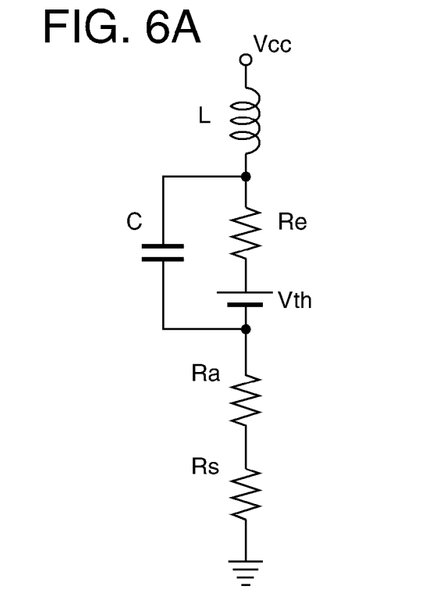
FIGS. 6A through 6C are explanatory diagrams schematically showing the light source circuit with the shunt transistor in the OFF state.
Figure 6B:
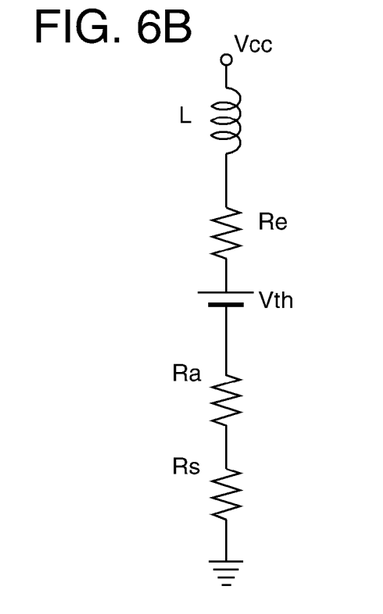

FIG. 6A is the same drawing as FIG. 5B, and shows the equivalent circuit of the light source circuit 300a with the switching transistor Q1 in the ON state. FIG. 6B shows an equivalent circuit obtained by simplifying the equivalent circuit shown in FIG. 6A. The equivalent circuit shown in FIG. 6B is determined based on a relationship between the circuit current I flowing through the equivalent circuit shown in FIG. 6A and energy $\epsilon_L$, $\epsilon_C$ respectively stored in the inductance L and the capacitance C. It should be noted that in the light source circuit 300a shown in FIG. 1 and the light source circuit 300 (FIG. 4) with the shunt transistor Q2 in the OFF state (non-shunted state), there exists no channel of a current not flowing through the laser diode LD. Therefore, in these cases, the circuit current I matches with the drive current $I_{LD}$ of the laser diode LD.

Here, the state in which the switching transistor Q1 (FIG. 5A) is steadily maintained in the ON state, namely the case in which the laser diode LD is driven in a direct-current manner is considered. In this case, the direct-current circuit current $I_0$ flowing through the equivalent circuit shown in FIG. 6A is obtained by the following formula 1 using the circuit parameters of the equivalent circuit shown in FIG. 6A.

$$Vcc=Vth+Re \times I_0+(Rs+Ra) \times I_0 \quad (1)$$

The energy $\epsilon_L$ stored in the inductance L and the energy $\epsilon_C$ stored in the capacitance C are respectively obtained by the following formulas 2, 3.

$$\varepsilon_L = \frac{1}{2}LI^2 = \frac{1}{2}L \times I_0^2 \quad (2)$$

$$\varepsilon_C = \frac{1}{2}CV^2 = \frac{1}{2}C(Vth + Re \times I_0)^2 = \frac{1}{2}C \times Re^2 \times \left(\frac{Vth}{Re} + I_0\right)^2 \quad (3)$$

Here, the threshold voltage Vth estimated from the I-V characteristic shown in FIG. 5C is about 1.2V, and the equivalent resistance Re thus estimated is about 1Ω. Further, in the case of using a coaxial cable with a length of 50 mm and a characteristic impedance of 50Ω as the driving connection line 302 (see FIGS. 1 and 4), the inductance L of about 13 nH, and the capacitance C of about 6 pF are obtained. Therefore, the relationship between the direct-current circuit current $I_0$ and the energy $\epsilon_L$, $\epsilon_C$ respectively stored in the inductance L and the capacitance C is obtained as shown in FIG. 6C.

Figure 6C:
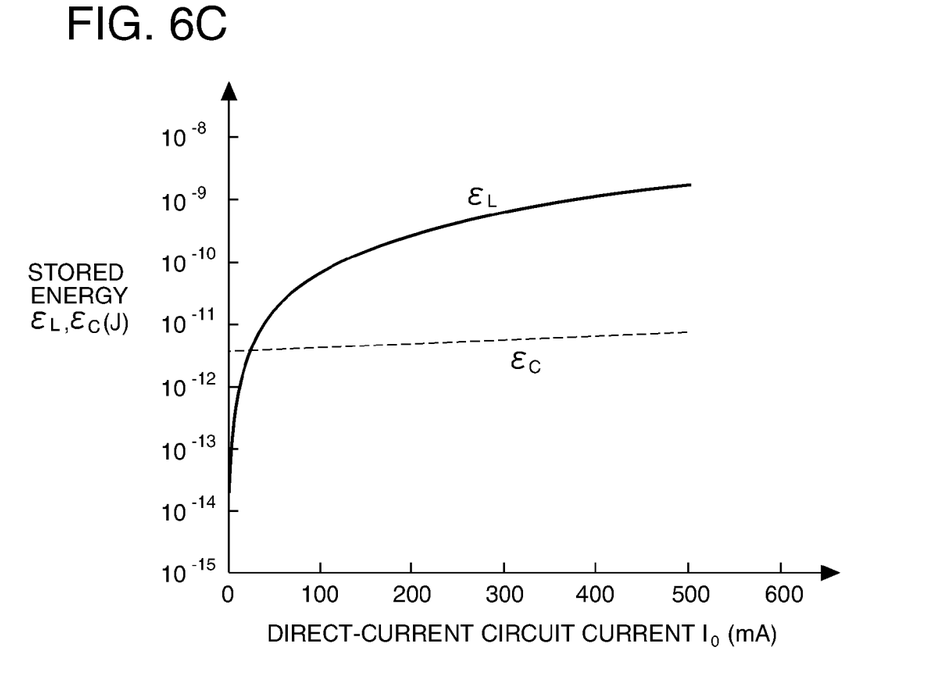

As is understood from FIG. 6C, in the case in which the direct-current circuit current $I_0$ is significantly small, the energy $\epsilon_L$ stored in the inductance L is smaller than the energy $\epsilon_C$ stored in the capacitance C. The energy $\epsilon_L$ stored in the inductance L rapidly increases as the direct-current circuit current $I_0$ becomes larger. Then, when the direct-current circuit current $I_0$ becomes several hundreds of mA used for driving the laser diode LD, the energy $\epsilon_L$ stored in the inductance L becomes far greater than the energy $\epsilon_C$ stored in the capacitance C. Therefore, although the influence of the capacitance C on the circuit characteristic of the light source circuit 300a is significant in the case in which the direct-current circuit current $I_0$ is significantly small, the inductance L exerts a significant influence on the circuit characteristic in the case of driving the laser diode LD with a current of several hundreds of mA, namely in the case of setting the direct-current circuit current $I_0$ to be several hundreds of mA.

As described above, in the present embodiment, since the inductance L acts dominantly on the circuit characteristic, the light source circuit 300a can be modeled as shown in FIG. 6B using the equivalent circuit obtained by eliminating the capacitance C from the equivalent circuit shown in FIG. 6A.

C. Response Characteristic of Light Source Circuit

COMPARATIVE EXAMPLE

Figure 7A:
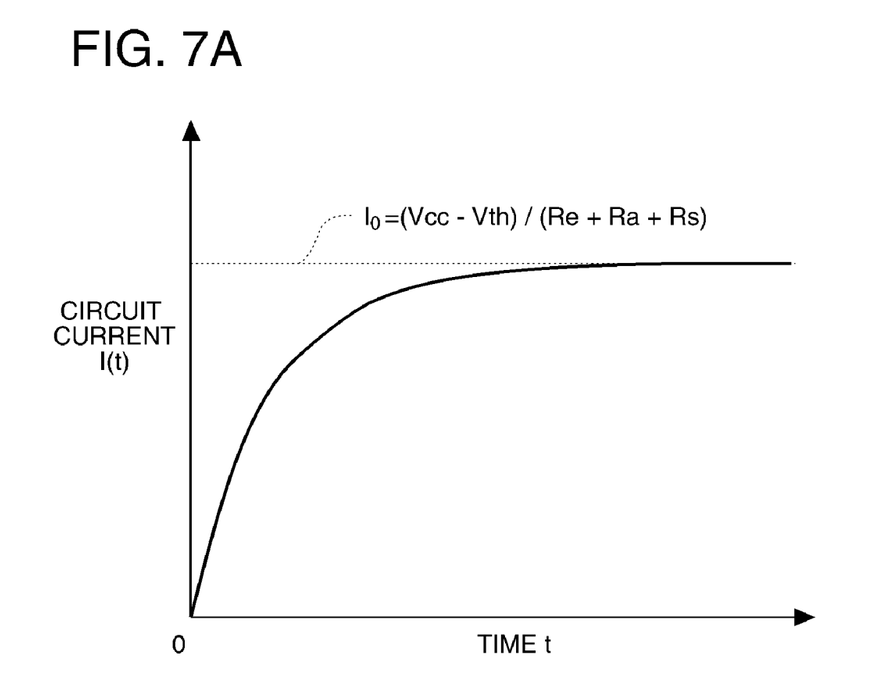
FIGS. 7A and B are explanatory diagrams showing a response characteristic of a light source circuit of a comparative example.
Figure 7B:
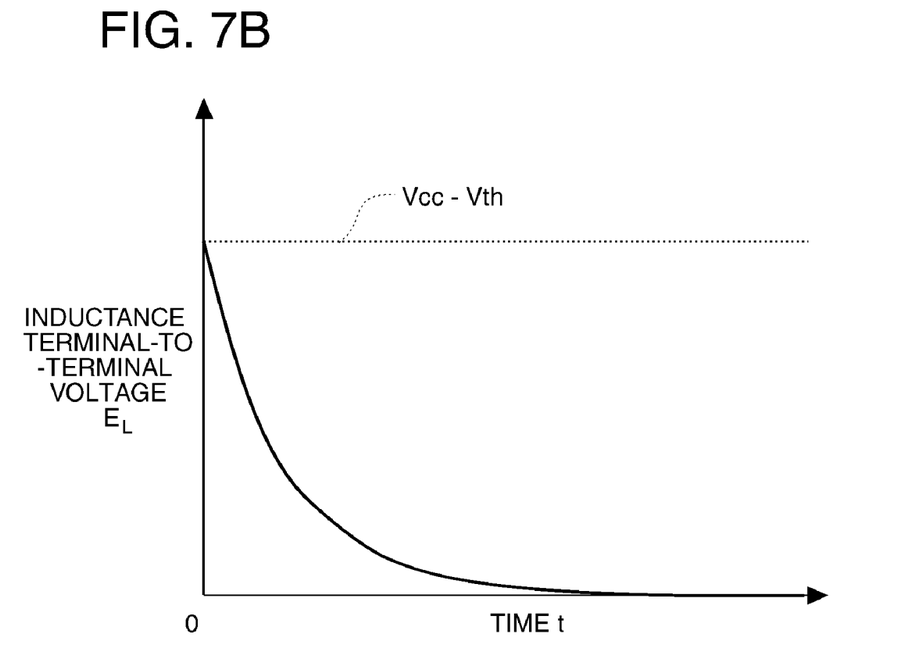

FIGS. 7A and 7B are explanatory diagrams showing the response characteristic of the light source circuit 300a (FIG. 1) as a comparative example. Here, the response characteristic denotes a characteristic of rising of the circuit current I when the PWM signal supplied to the switching transistor Q1 of the light source circuit 300a rises from the L-level to the H-level.

The response characteristic of the equivalent circuit shown in FIG. 6C is represented by a differential equation with respect to time t shown in the following formula 4.

$$V = L\frac{dI}{dt} + R \times I \quad (4)$$

Where $V = Vcc - Vth$, $R = Re + Ra + Rs$

By solving the differential equation shown in the formula 4 under the condition of assuming that the circuit current I(t) corresponding to time t=0 is equal to 0 (I(0)=0), the circuit current I(t) is obtained by the following formula 5 using the steady-state current value (the direct-current circuit current) $I_0$ and a time constant τ.

$$I(t)=I_0 \times (1-e^{-t/\tau}) \quad (5)$$

Here, the steady-state current value $I_0$ and the time constant τ are respectively obtained by the following formulas 6, 7.

$$I_0 = \frac{V}{R} = \frac{Vcc - Vth}{Re + Ra + Rs} \quad (6)$$

$$\tau = \frac{L}{R} = \frac{L}{Re + Ra + Rs} \quad (7)$$

FIG. 7A is a graph showing the time variation of the circuit current I expressed by the formula 4 described above. As shown in FIG. 7A, the circuit current I gradually rises from the timing (t=0) when the switching transistor Q1 is switched from the OFF state to the ON state, and reaches the steady-state current value $I_0$ after a sufficient amount of time t has elapsed.

As is understood from the formula 7 described above, by increasing the load resistance Ra, it is possible to decrease the time constant τ. As described above, by decreasing the time constant τ, it becomes possible to make the rising of the circuit current I faster. It should be noted that as is understood from the formula 6 described above, if the load resistance Ra is increased, it is required to set the power supply voltage Vcc to be higher in order for keeping the steady-state current $I_0$ in the same level. Further, by increasing the load resistance Ra, the power consumption also increases. Therefore, in order for reducing the power supply voltage Vcc and the power consumption, it is more preferable not to provide the load resistance Ra (i.e., Ra=0Ω).

The terminal-to-terminal voltage $E_L$ of the inductance L is obtained by the following formula 8. FIG. 7B is a graph showing the time variation of the inductance terminal-to-terminal voltage $E_L$ expressed by the formula 8.

$$E_L = L\frac{dI(t)}{dt} = V \times e^{-t/\tau} \quad (8)$$

As shown in the formula 8 described above and FIG. 7B, a voltage corresponding to the difference (Vcc−Vth) between the power supply voltage Vcc and the threshold voltage Vth is applied between the both terminals of the inductance L at the timing (t=0) at which the switching transistor Q1 is switched from the OFF state to the ON state. Then, the voltage applied thereto is gradually lowered as the time t elapses. As described above, the delay in rising of the circuit current I occurs due to the voltage $E_L$ between the both terminals of the inductance L varying gradually.

D. Response Characteristic of Light Source Circuit (Present Embodiment)

Figure 8A:
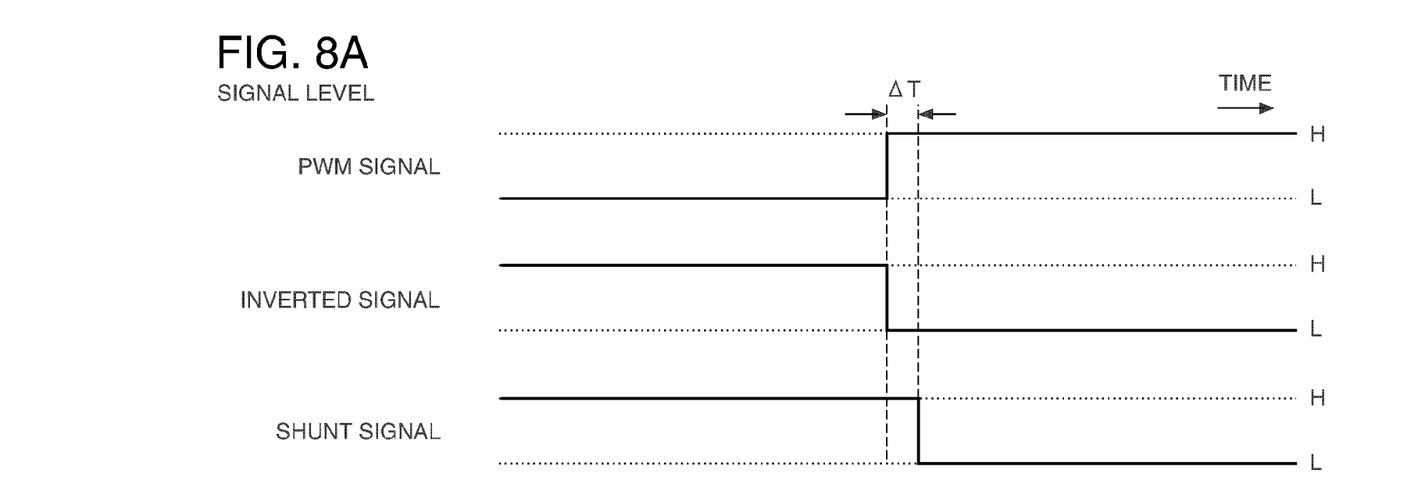
FIGS. 8A and 8B are explanatory diagrams showing a time variation of levels of respective signals of the image output unit and an ON/OFF state of the transistor.
Figure 8B:
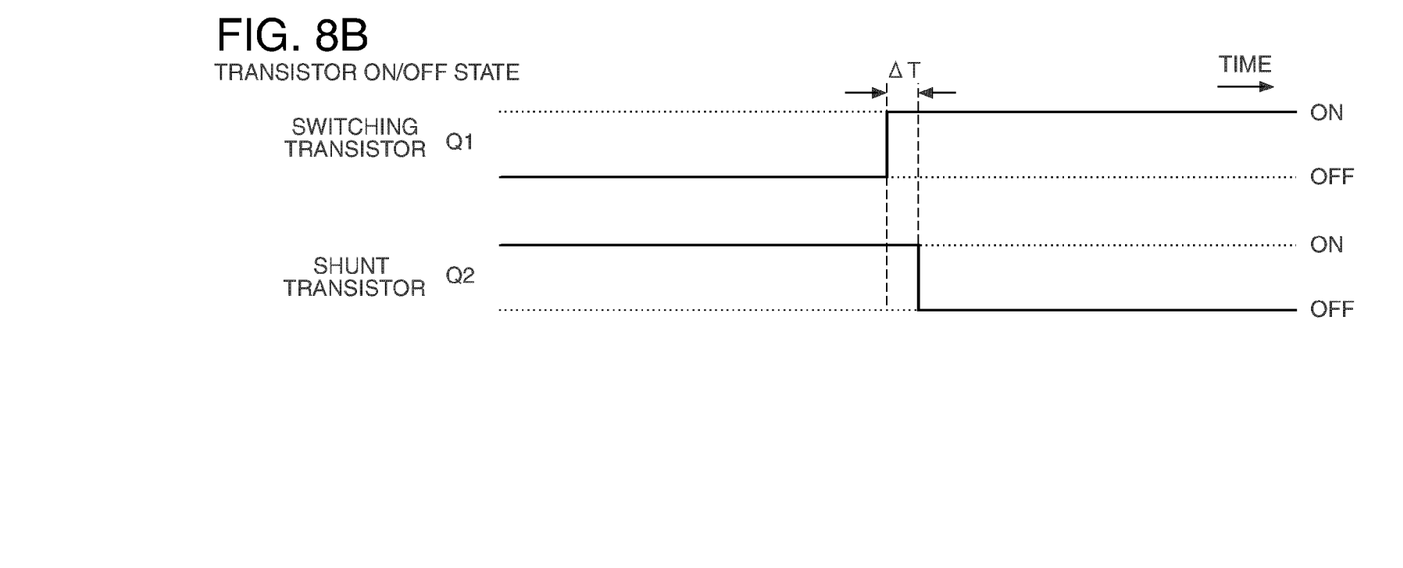

FIGS. 8A and 8B are explanatory diagrams showing the time variation of the levels of the signals in the image output unit 10 of the present embodiment and the ON/OFF state of each of the two transistors Q1, Q2. The horizontal axis of each of the graphs shown in FIGS. 8A and 8B represents time. The graphs of FIG. 8A show the levels of the PWM signal, an inverted signal obtained by inverting the PWM signal, and the shunt signal obtained by delaying the inverted signal with the delay time ΔT, respectively in this order from the top. The graphs of FIG. 8B show the ON/OFF states of the switching transistor Q1 and the shunt transistor Q2, respectively in this order from the top.

As described above, in the present embodiment, the PWM signal is applied to the gate of the switching transistor Q1, and the shunt signal obtained by inverting and delaying the PWM signal is applied to the gate of the shunt transistor Q2. Therefore, as shown in FIG. 8B, the shunt transistor Q2 is in the ON state prior to switching the switching transistor Q1 from the OFF state to the ON state. Then, the shunt transistor Q2 is switched to the OFF state after the delay time ΔT has elapsed from the switching of the switching transistor Q1 to the ON state.

Figure 9A:
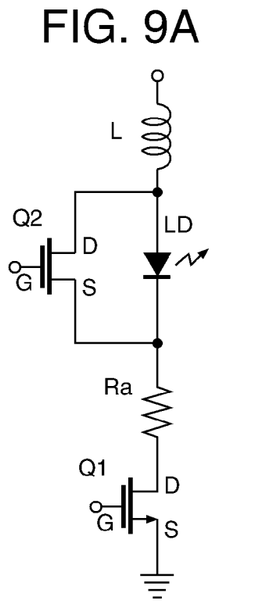
FIGS. 9A through 9D are explanatory diagrams showing a response characteristic of the light source circuit of the embodiment.
Figure 9B:
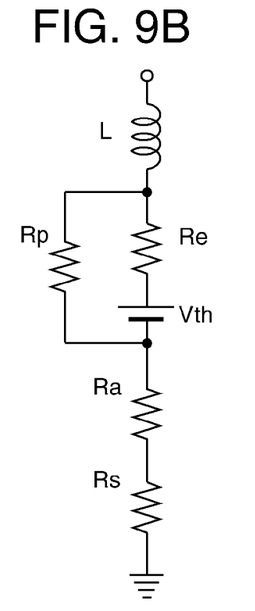
Figure 9C:
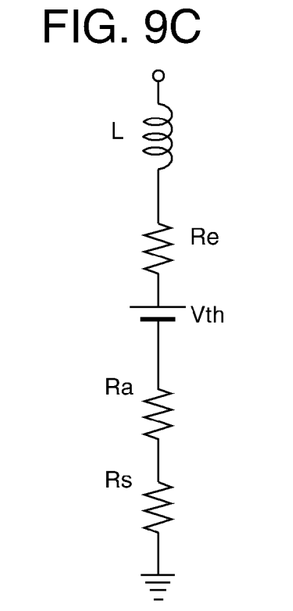
Figure 9D:
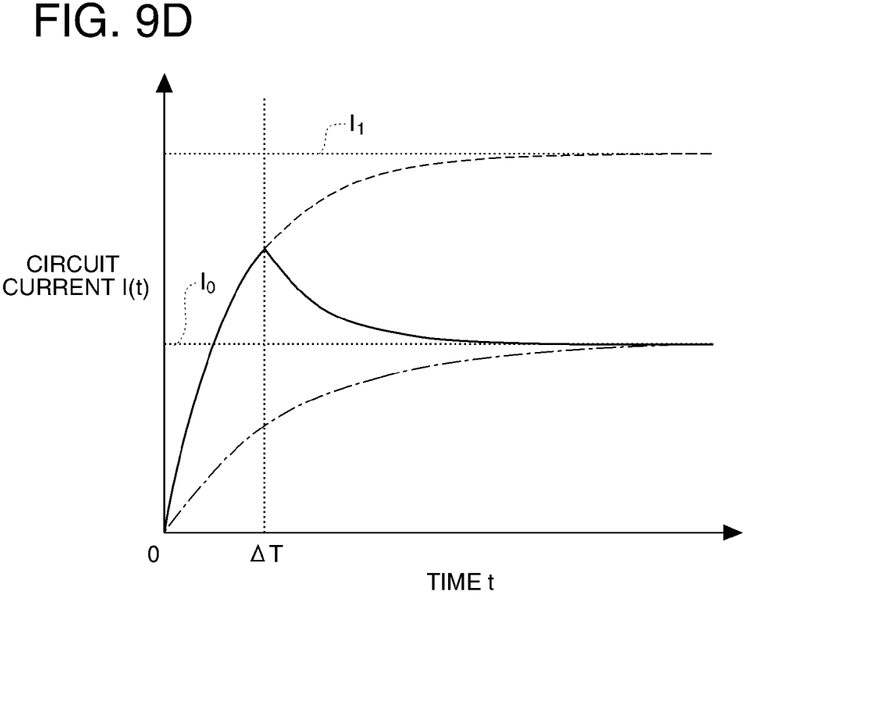

FIGS. 9A through 9D are explanatory diagrams showing a response characteristic of the light source circuit 300 of the present embodiment. FIG. 9A shows the light source circuit 300 having the driving connection line 302 modeled with an inductance L. FIG. 9B shows an equivalent circuit of the light source circuit 300 in the case of having the shunt transistor Q2 in the ON state. FIG. 9C shows an equivalent circuit of the light source circuit 300 in the case of having the shunt transistor Q2 in the OFF state, which is the same drawing as shown in FIG. 6B. FIG. 9D is a graph showing the time variation of the circuit current I in the present embodiment.

As shown in FIG. 4, in the light source circuit 300 of the present embodiment, the shunt transistor Q2 is disposed on the laser diode LD side of the driving connection line 302. Therefore, as shown in FIG. 9A, the light source circuit 300 can be modeled as a circuit in which the drain (D) of the shunt transistor Q2 is connected to a channel between the inductance L and the anode of the laser diode LD, and the source (S) thereof is connected to the channel between the cathode of the laser diode LD and the load resistance Ra.

The laser diode LD can be represented by the equivalent resistance Re and the direct-current voltage source Vth, and the shunt transistor Q2 in the ON state can be represented by a shunt resistance Rp. Therefore, the light source circuit 300 with the two transistors Q1, Q2 set to be in the ON state can be represented by the equivalent circuit shown in FIG. 9B.

As described above, the current hardly flows through the laser diode LD until the inter-terminal voltage $V_{LD}$ of the laser diode LD exceeds the threshold voltage Vth. In other words, the impedance of the laser diode LD in this state has become extremely high. In contrast, the impedance of the shunt transistor Q2 corresponds directly to the shunt resistance Rp, and is far lower than the impedance of the laser diode LD. Therefore, the most part of the circuit current I flows through the channel between the drain (D) and the source (S) of the shunt transistor Q2. It should be noted that a shunted state denotes a state in which two or more points in a circuit having a potential difference are intentionally connected to each other with a relatively low resistance or a relatively low impedance. Therefore, in the present specification, the state in which the laser diode LD is shunted denotes the ON state of the shunt transistor Q2, namely the state in which the apparent impedance between the both terminals of the laser diode LD is set to be low. Further, this state can also be recognized as a state in which a bypass channel for bypassing the laser diode LD is created.

As described above, when the shunt transistor Q2 is set in the ON state, the drive current $I_{LD}$ flowing through the laser diode LD can be neglected. Therefore, the response characteristic of the equivalent circuit shown in FIG. 9B is represented by a differential equation with respect to time t shown in the following formula 9.

$$Vcc = L\frac{dI}{dt} + R \times I \tag{9}$$

Where $R = Rp + Ra + Rs$

By solving the differential equation shown in the formula 9 under the condition of assuming that the circuit current I(t) corresponding to time t=0 is equal to 0 (I(0)=0), the circuit current I(t) is obtained by the following formula 10 using the steady-state current value $I_1$ and a time constant $\tau 1$.

$$I(t) = I_1 \times (1 - e^{-t/\tau 1}) \tag{10}$$

Here, the steady-state current value $I_1$ and the time constant $\tau 1$ are respectively obtained by the following formulas 11, 12.

$$I_1 = \frac{Vcc}{Rp + Ra + Rs} \tag{11}$$

$$\tau 1 = \frac{L}{Rp + Ra + Rs} \tag{12}$$

As is understood from the formula 10, the circuit current I(t) rises from the timing (t=0), at which the switching transistor Q1 has been switched from the OFF state to the ON state, towards the steady-state current value $I_1$. Then, the shunt transistor Q2 is switched to the OFF state when the delay time ΔT has elapsed from the switching of the switching transistor Q1 to the ON state.

The light source circuit 300 after the shunt transistor Q2 is switched to the OFF state is represented by the equivalent circuit shown in FIG. 9C. Therefore, the circuit current I(t) on and after the delay time ΔT is represented by the differential equation shown in formula 4. By solving the differential equation of the formula 4, the circuit current I(t) on and after the delay time ΔT is obtained by the following formula 13 using the steady-state current value $I_0$ and the time constant $\tau$ respectively obtained by the formulas 6, 7 described above.

$$I(t) = (I_x - I_0) \times e^{-t/\tau} + I_0 \tag{13}$$

Where $I_x = I_1 \times (1 - e^{\Delta T/\tau 1})$

As is understood from the formula 13, in a period on and after the delay time ΔT, the circuit current I(t) varies towards the steady-state current value $I_0$. Then, in the period on and after the delay time ΔT, the shunt transistor Q2 is switched to the OFF state, and therefore, the circuit current I flows through the laser diode LD.

Here, in the case of using the values shown in the following table as the circuit parameters in FIGS. 9B and 9C, in a non-shunted state in which the shunt transistor Q2 is in the OFF state, the steady state current value $I_0$ of 550 mA and the time constant τ of 6.5 ns are obtained. Further, in the shunted state in which the shunt transistor Q2 is in the ON state, the steady state current value $I_1$ of 657 mA and the time constant $\tau 1$ of 3.7 ns are obtained. It should be noted that as is understood from the relationships between the steady-state current values $I_0$, $I_1$ and the time constants $\tau$, $\tau1$, a transistor having an ON resistance higher than that of the switching transistor Q1 can be used as the shunt transistor Q2.

TABLE 1

CIRCUIT PARAMETERS

| NAME | SYMBOL | PARAMETER VALUE | UNIT |
| --- | --- | --- | --- |
| INDUCTANCE | L | 13 | nH |
| LOAD RESISTANCE | Ra | 0 | Ω |
| SWITCHING TRANSISTOR ON RESISTANCE | Rs | 1 | Ω |
| SHUNT TRANSISTOR ON RESISTANCE | Rp | 2.5 | Ω |
| LASER DIODE EQUIVALENT RESISTANCE (DIFFERENTIAL RESISTANCE) | Re | 1 | Ω |
| LASER DIODE THRESHOLD VOLTAGE | Vth | 1.2 | V |
| POWER SUPPLY VOLTAGE | Vcc | 2.3 | V |

As described above, the steady-state current value $I_1$ in the shunted state is larger than the steady-state current value $I_0$ in the non-shunted state ($I_1 > I_0$), and the time constant $\tau1$ in the shunted state is smaller than the time constant $\tau$ in the non-shunted state ($\tau1 < \tau$). Therefore, the circuit current I(t) in the present embodiment illustrated with the solid line in FIG. 9D rises rapidly toward the steady-state current value $I_1$ higher than the value in the comparative example illustrated with the dashed line. Then, when the delay time ΔT has elapsed, the circuit current I(ΔT), which has risen to a sufficiently high level, is made to flow through the laser diode LD. As described above, in the present embodiment, by connecting the shunt transistor Q2 in parallel to the laser diode LD, it is possible to make the rising of the drive current $I_{LD}$ flowing through the laser diode LD faster.

E. Drive Control of Laser Diode LD

Figure 10:
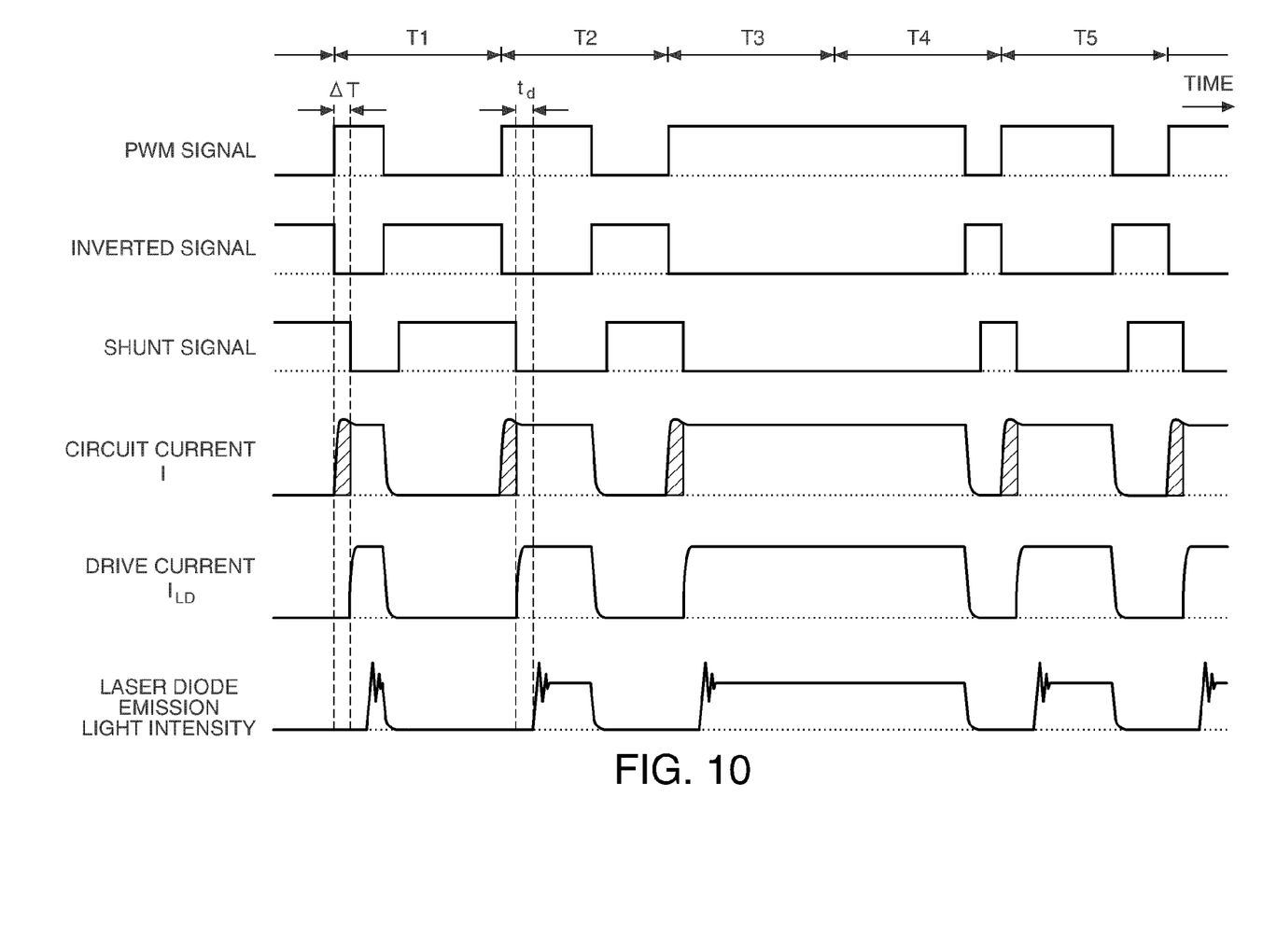
FIG. 10 is a timing chart showing a process of drive control for the laser diode.

FIG. 10 is a timing chart showing the process of the drive control of the laser diode LD in the present embodiment. The horizontal axis of each of the graphs shown in FIG. 10 represents time. As shown in FIG. 10, the circuit current I rises at the rising edge of the PWM signal. Further, the drive current $I_{LD}$ rises at the falling edge of the shunt signal. Further, the emission light intensity of the laser diode LD rises with a delay time td after the rising edge of the drive current $I_{LD}$. The circuit current I, the drive current $I_{LD}$, and the emission light intensity of the laser diode LD each fall at the falling edge of the PWM signal.

As shown in FIG. 10, in the present embodiment, the shunt signal is generated by inverting and delaying the PWM signal, and the ON/OFF state of the shunt transistor Q2 is switched with the shunt signal thus generated. Therefore, the shunt current flowing through the shunt transistor Q2 (not flowing through the laser diode LD) is limited to the area indicated by hatching in FIG. 10. Therefore, in the period T4 after displaying a pixel with the maximum light intensity in the period T3, the shunt current is prevented from flowing. Therefore, by generating the shunt signal as in the present embodiment, increase in power consumption is suppressed.

Further, the shunt current only flows during the delay time ΔT at the beginning of each of the pixel time T1 through T5. It is sufficient for the delay time ΔT to be the time with which the circuit current I in the shunted state reaches the steady-state current value $I_0$ in the non-shunted state, and the delay time ΔT can be set to be sufficiently shorter than each of the pixel time T1 through T5. As described above, if the delay time ΔT during which the shunt current flows is set to be sufficiently shorter than each of the pixel time T1 through T5, the heating value in the shunt transistor Q2 is reduced. Therefore, a transistor with smaller allowable loss and higher ON resistance than those of the switching transistor Q1 can be used as the shunt transistor Q2. In general, the smaller the allowable loss is, and the higher the ON resistance is, the smaller the size of the transistor becomes. Therefore, since a transistor smaller than the switching transistor Q1 can be used as the shunt transistor Q2, it becomes possible to dispose the shunt transistor Q2 closer to the laser diode LD.

F. Laser-Scanning Display as One Embodiment

Figure 11:
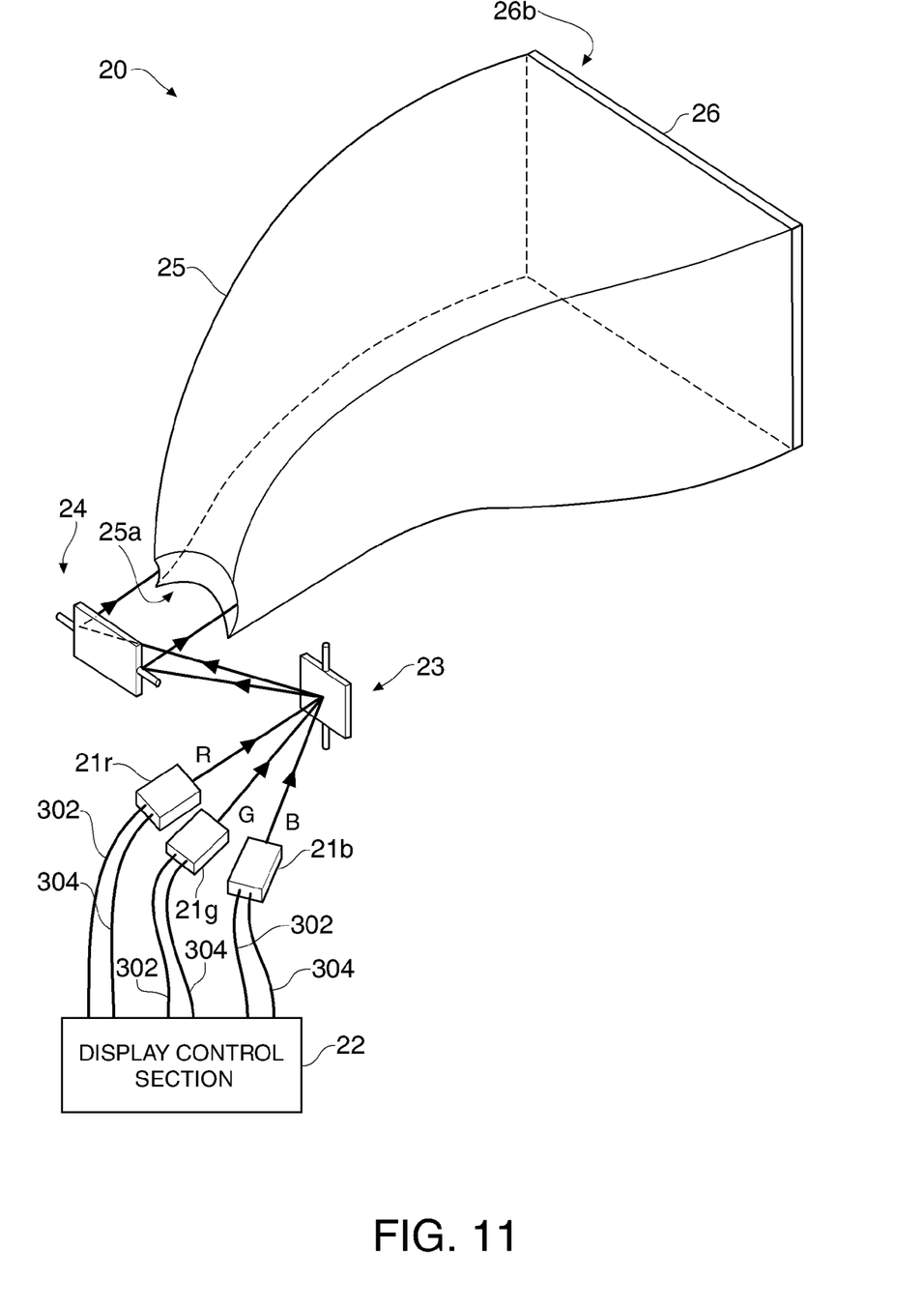
FIG. 11 is a schematic diagram showing a structure of a laser-scanning display.

FIG. 11 is a schematic diagram showing a structure of a laser-scanning display 20 as an embodiment. The laser-scanning display 20 is provided with laser sources 21r, 21g, 21b respectively emitting laser beams with three colors, namely red (R), green (G), and blue (B). Each of the laser sources 21r, 21g, 21b has the laser diode LD, the shunt transistor Q2, and the termination resistance Rt incorporated therein. A display control section 22 is provided with the grayscale control section 100, the PWM signal generation circuit 200, the inverting delay circuit 310, and the switching transistor Q1 for each of the colors of RGB. Each of the laser sources 21r, 21g, 21b is connected to the display control section 22 with the driving connection line 302 and the shunt signal connection line 304. As described above, the emission light intensity from the laser sources 21r, 21g, 21b is controlled for each of the pixels.

The laser-scanning display 20 is also provided with two galvanometer mirrors 23, 24, a fiber waveguide 25, and a screen 26. The galvanometer mirrors 23, 24 scan the laser beams respectively emitted from the laser sources 21r, 21g, 21b in the respective directions perpendicular to each other. The laser beams thus scanned enter an end surface 25a of the fiber waveguide 25. The light beams entering the fiber waveguide 25 are guided to the screen 26 through each of the optical fibers constituting the fiber waveguide 25. By the light beams thus guided to the screen 26, an image is displayed on a front surface 26b of the screen 26. It should be noted that it is also possible to directly project the laser beams scanned by the galvanometer mirrors 23, 24 without using the fiber waveguide 25.

In the laser-scanning display 20, by incorporating the laser diode LD, the shunt transistor Q2, and the termination resistance Rt in each of the laser sources 21r, 21g, 21b, speeding-up of rising of the drive current $I_{LD}$ of the laser diode LD can be achieved. Thus, rising of the emission light intensity from the laser diode LD becomes faster. Therefore, it becomes easier to perform the grayscale control of each of the pixels of the image displayed on the screen 26, and further, it becomes possible to increase the maximum luminance of the image to be displayed on the screen 26.

G. Modified Examples

It should be noted that the invention is not limited to the specific examples and the embodiments described above, but can be put into practice in various forms within the scope or the spirit of the invention, and the following modifications, for example, are also possible.

G1. Modified Example 1

Although in the embodiment described above, the shunt signal is generated by inverting and delaying the PWM signal, the shunt signal can also be generated by various methods. The shunt signal can also be generated using, for example, independently the drawing clock, or the drawing clock and the drawing data in combination. In general, any signal, which makes the shunt transistor Q2 in the ON state in at least a part of the period (transitional period) from when the switching transistor Q1 is switched from the OFF state to the ON state to when the circuit current reaches the steady-state current value, can be used as the shunt signal. It should be noted that it is more preferable for the shunt transistor Q2 to be in the ON state at the timing at which the switching transistor Q1 is switched to the ON state because it is possible to make the rising of the circuit current faster.

G2. Modified Example 2

Although in the embodiment described above the laser diode LD is used as the light emitting element used in the light source circuit 300 (FIG. 4), it is possible to use various types of light emitting elements such as a light emitting diode (LED) can be used instead of the laser diode LD.

G3. Modified Example 3

Although in the embodiment described above the invention is applied to the laser-scanning display 20, the invention can also be applied to various types of apparatuses providing the apparatuses are for controlling the average emission light intensity of the light emitting element by executing the pulse width modulation. The invention can be applied to various types of image display devices such as a laser projector or a laser rear projection display apparatus.

The entire disclosure of Japanese Patent Application No. 2008-246238, filed Sep. 25, 2008 is expressly incorporated by reference herein.

What is claimed is:

1. A light source device comprising:
a light emitting element;
a pulse drive section adapted to supply the light emitting element with a pulse current in order for controlling an average emission light intensity from the light emitting element; and
a light emitting element shunt section connected in parallel to the light emitting element and adapted to shunt the light emitting element by shunting the pulse current only for a predetermined period of time after the pulse current switches from a low level to a high level.

2. The light source device according to claim 1, wherein the light emitting element shunt section shunts the light emitting element in a transitional period of the pulse current.

3. The light source device according to claim 1 further comprising:
a pulse signal generation section adapted to generate a pulse signal for instructing the pulse drive section to supply the light emitting element with the pulse current; and
a shunt signal generation section adapted to generate a shunt signal for instructing the light emitting element shunt section to shunt the light emitting element,
wherein the shunt signal generation section generates the shunt signal based on a signal obtained by delaying the pulse signal.

4. The light source device according to claim 3 further comprising:
a shunt signal connection line adapted to connect the shunt signal generation section and the light emitting element shunt section to each other; and
a termination element disposed on the light emitting element shunt section side of the shunt signal connection line.

5. The light source device according to claim 3, wherein the pulse signal generation section generates the pulse signal so as to provide a continuous current to the light emitting element when the average emission light intensity is set to be maximum.

6. The light source device according to claim 1, wherein
the pulse drive section supplies the light emitting element with the pulse current by switching an ON state and an OFF state of a switching transistor, and
the light emitting element shunt section shunts the light emitting element by setting a shunting transistor to be the ON state.

7. The light source device according to claim 6, wherein the shunting transistor has an allowable loss smaller than that of the switching transistor.

8. The light source device according to claim 6, wherein the shunting transistor has an ON resistance higher than that of the switching transistor.

9. The light source device according to claim 6 further comprising:
a shunt signal generation section adapted to generate a shunt signal for instructing the shunting transistor to shunt the light emitting element;
a shunt signal connection line adapted to connect the shunt signal generation section and the shunting transistor to each other; and
a termination element disposed on the shunting transistor side of the shunt signal connection line.

10. The light source device according to claim 9, wherein the termination element is a resistance, and
an impedance of the resistance is approximately the same as an impedance of the shunt signal connection line.

11. The light source device according to claim 6 further comprising:
a shunt signal generation section adapted to generate a shunt signal for instructing the shunting transistor to shunt the light emitting element,
wherein the shunt signal generation section generates the shunt signal so that the shunting transistor is in the ON state at a timing at which the switching transistor is switched to the ON state.

12. The light source device according to claim 11, wherein the shunt signal generation section generates the shunt signal based on a signal obtained by delaying a pulse signal for instructing the pulse drive section to supply the light emitting element with the pulse current.

13. The light source device according to claim 12, wherein the shunt signal generation section generates the shunt signal based on a signal obtained by inverting the pulse signal.

14. An image display apparatus comprising:
the light source device according to claim 1; and
a scanning section adapted to generate a display image by scanning emission light from the light emitting element provided to the light source device.

15. A driving method for a light emitting element, comprising:
supplying the light emitting element with a pulse current in order for controlling an average emission light intensity from the light emitting element; and
shunting the light emitting element only in a transitional period of the pulse current as the pulse current switches from a low level to a high level.

16. The driving method according to claim 15 further comprising:
generating a pulse signal for instructing to supply the light emitting element with the pulse current; and
generating the pulse signal so as to provide a continuous current to the light emitting element when the average emission light intensity is set to be maximum.

17. The driving method according to claim 15 further comprising:
 generating a shunt signal for shunting the light emitting element based on a pulse signal for instructing to supply the light emitting element with the pulse current; and
 delaying the pulse signal when generating the shunt signal.

18. A light source device using a light emitting element, comprising:
 a pulse drive section adapted to supply the light emitting element with a pulse current in order for controlling an average emission light intensity from the light emitting element; and
 a rising acceleration section adapted to make rising of the pulse current faster by shunting the light emitting element by shunting the pulse current only for a predetermined period of time after the pulse current switches from a low level to a high level.

* * * * *